United States Patent [19]

De Faveri et al.

[11] Patent Number: 4,620,166

[45] Date of Patent: Oct. 28, 1986

[54] MULTIPLE WOUND CAPACITOR NOISE FILTER WITH COMMON LAYER

[75] Inventors: Americo De Faveri, Longarone; Sergio Zanvettor, Ospitale di Cadore; Antonio Savi, Dogna di Longarone, all of Italy

[73] Assignee: Zanussi Elettromeccanica S.p.A., Pordenone, Italy

[21] Appl. No.: 435,398

[22] Filed: Oct. 19, 1982

[30] Foreign Application Priority Data

Nov. 27, 1981 [IT] Italy .............................. 34052/81[U]

[51] Int. Cl.<sup>4</sup> ......................... H03H 7/00; H01G 4/38
[52] U.S. Cl. .................................. 333/184; 333/185; 361/330
[58] Field of Search ....................... 333/167, 181–182, 333/184–185; 361/328, 329, 330, 313–324, 308, 309

[56] References Cited

U.S. PATENT DOCUMENTS

| 2,087,408 | 7/1937 | Katzman | 361/329 |
| 2,493,231 | 1/1950 | De Lange | 361/308 |
| 2,918,633 | 12/1959 | Schenker et al. | 333/185 |
| 3,705,336 | 12/1972 | Kalstein | 361/330 |

FOREIGN PATENT DOCUMENTS 425745 3/1935 United Kingdom .

Primary Examiner—Marvin L. Nussbaum

[57] ABSTRACT

A single-winding capacitive filter having two metal layers separated by a dielectric and forming a plurality of capacitors having at least one common wound layer. One of the metal layers protrudes from one end of the wound layer at least for a certain number of turns whose protruding portions are electrically interconnected by a short-circuit. The short-circuiting of one of the wound layers reduces the self inductance of the filter.

2 Claims, 6 Drawing Figures

MULTIPLE WOUND CAPACITOR NOISE FILTER WITH COMMON LAYER

BACKGROUND OF THE INVENTION

1. Field of the Invention

The present invention relates to a filter for the elimination of radio noise. More particularly, the present invention relates to a filter comprising several wound capacitors having a common electrode layer.

2. Description of the Prior Art

As is known, class Y type filters comprise at least two capacitors, which can be connected between respective phases of the electrical power supply and ground, for the elimination of asymmetrical noise. In addition, it is common practice to equip such filters with at least one capacitor, forming a class X type filter, which can be connected between the phases of the electrical power supply for the elimination of symmetrical noise. Ultimately, the filters of the type mentioned above can be implemented in such a way as to obtain capacitive circuits of various configurations, depending on the specific requirements.

There is a known implementation of such filters with a single winding comprising a continuous metal sheet and a discontinuous metal sheet separated by a dielectric tape. A certain number of single capacitors (for example, three) are thus obtained so as to have a first common wound electrode layer consisting of the continuous metal sheet and a second wound electrode layer consisting of respective portions of a discontinuous metal sheet.

Due to electrical insulation reasons, the dielectric tape is wider than the metal sheets. The metal sheets are connected in a known fashion to contact terminals, of the blade (vane) type, coming out axially of the front side of the wound layer. Preferably, only the portions of the discontinuous metal sheet are equipped with terminals, for the respective connections to the ground and to the phases of the power supply system.

The single-winding capacitive filters of this type are easy and compact to build. However, they present stray inductances due to the fact that the continuous metal sheet has a relatively high number of turns.

Such stray inductances are formed due to the common wound layer of the three capacitors and negatively affect the operation of the entire capacitive filter; in fact, the filter operation may be unacceptable when the currents involved have particularly high frequencies.

SUMMARY OF THE INVENTION

In accordance with the present invention, provision is made for a single-winding capacitive filter comprising a continuous metal layer and a discontinuous metal layer separated by a dielectric and forming a plurality of capacitors having at least one common wound layer. The non-common wound layers of said capacitors comprise respective portions of the discontinuous metal layer and are each equipped with respective terminals coming out of one end of the wound layer. The filter is characterized by the fact that the continuous metal layer protrudes from an opposite second end of the wound layer at least for a certain number of turns whose protruding portions are interconnected by means of a short-circuit means.

The capacitive filter in accordance with the present invention, although it preserves a simple and compact structure, makes it, therefore, possible to minimize, by short-circuiting them, the stray inductances which are formed due to the common wound layer of the capacitors.

BRIEF DESCRIPTION OF THE DRAWINGS

The characteristics and advantages of the present invention will be clarified by the following description, having only the purpose of a nonrestrictive example, with reference to the drawings, in which:

FIGS. 1A–3C correspond to a modified version of the embodiment illustrated in FIGS. 1–3.

DESCRIPTION OF THE PREFERRED EMBODIMENTS

Figure 1:
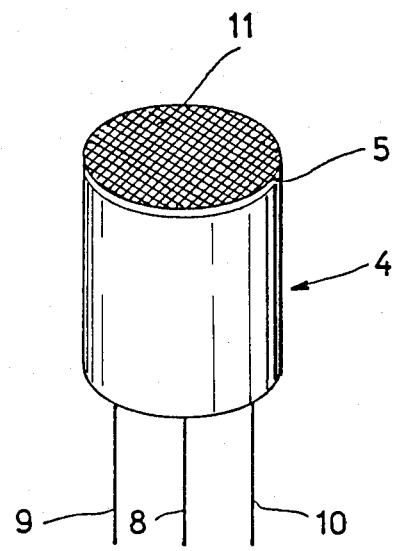
FIG. 1 illustrates a perspective view of a form of implementation of the capacitive filter in accordance with the present invention.
Figure 2:
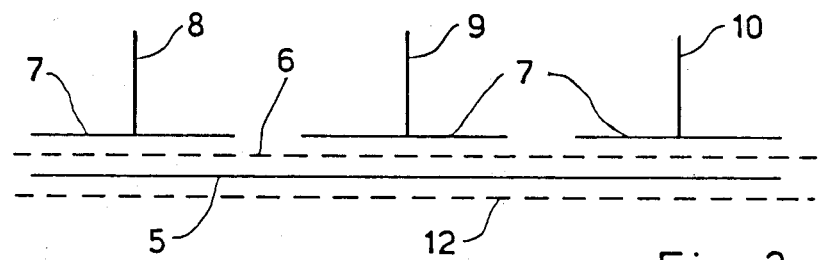
FIG. 2 illustrates the planar development of the filter of FIG. 1.
Figure 3:
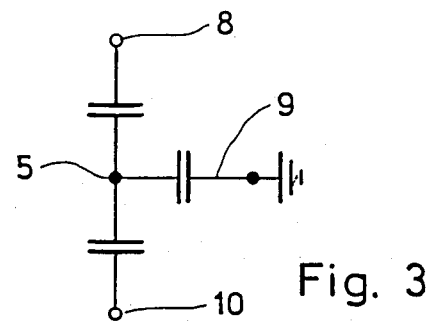
FIG. 3 shows the equivalent electric circuit of the filter of FIG. 1.
Figure 1A:
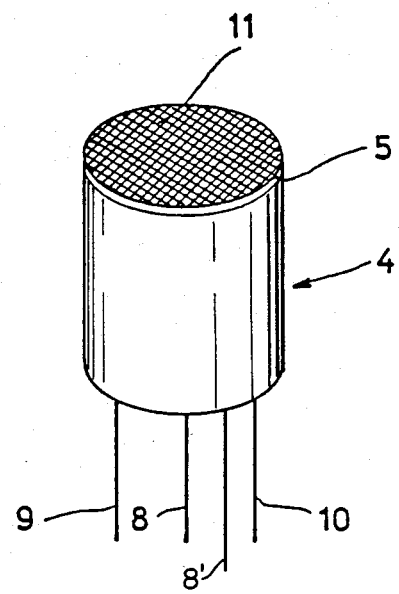
Figure 2A:
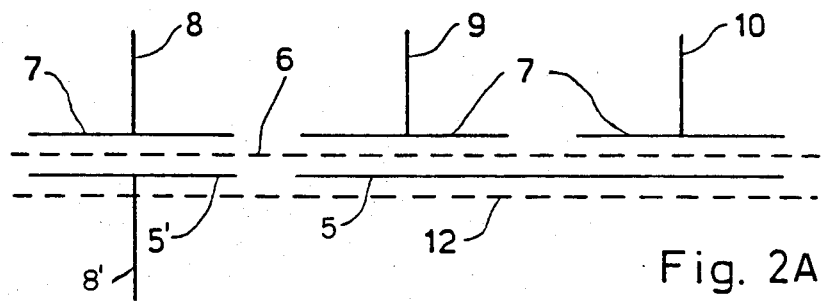
Figure 3A:
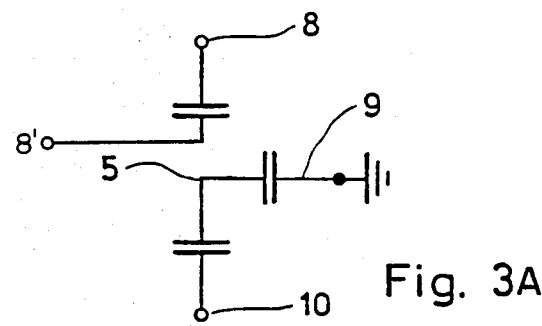

With reference to FIGS. 1–3 of the drawing figures, the capacitive filter in accordance with the present invention is of the type fabricated from a single wound arrangement 4. Such arrangement is obtained by starting with a continuous metal layer 5 onto which is overlayed, with the interposition of a dielectric layer 6, by a longitudinally discontinuous metal layer 7.

Furthermore, provision is made for an additional dielectric layer 12, used for normal insulation purposes, and located between the metal layers 5 and 7. Layer 12 serves to externally insulate arrangement 4. The metal layers 5 and 7 consist, for example, of respective aluminum sheets and are narrower in width than dielectric layers 6 and 12. In the illustrated example, the discontinuous metal layer 7 comprises three separate portions which are equipped with the respective terminals 8, 9, 10, of the blade or vane type, fastened in a known fashion and protruding axially from a frontal side of the filter.

The three separate portions of the metal sheet 7 form with the continuous metal sheet 5 respective capacitors having a common wound layer (consisting of the common metal sheet 5). The terminals 8 and 10 of the filter are suitable to be connected to respective phases of an A.C. power supply system, while terminal 9 is suitable for connection to the ground, as shown in FIG. 3. The relatively high number of turns of the continuous metal sheet 5 causes the formation of undesirable stray inductances, as mentioned above, which, in the circuit of FIG. 3, must be understood to be connected in series with each capacitor, in correspondence with common layer 5.

In accordance with the present invention, the continuous metal sheet 5 protrudes for a certain axial length from the end of the arrangement 4 opposite that from which terminals 8, 9, 10 protrude. Such a protrusion occurs for at least a certain number of turns of the metal sheet 5, but preferably throughout its length. The protruding turns of metal layer 5 can therefore be easily short-circuited, for example, by means of an aluminum layer 11, thus short-circuiting stray inductances, which are practically eliminated as intended by the present invention.

Obviously, the described capacitive filter, can undergo numerous modifications. For example, as shown in FIGS. 1A–3A, it may comprise a different number of capacitors having a common layer 5; in addition, also layer 5 may be discontinuous and a portion of it, layer 5; can form one or more separate capacitors in conjunction with a respective portion of metal layer 7, which can be suitably connected in order to obtain in a single arrangement 4, capacitors of class X and class Y. Obviously, only the common winding of class Y capacitors will be short-circuited in accordance with the present invention.

We claim:

1. A single-winding capacitive filter having first and second opposite ends and comprising: a wound continuous metal layer and a discontinuous metal layer separated by a dielectric, said layers forming a plurality of capacitors having at least one common wound layer and non-common wound layers, said non-common wound layers of said plurality of capacitors each comprise respective portions of said discontinuous metal layer and have respective terminals protruding axially from said first end of said filter, wherein said continuous metal layer protrudes from said second end of said filter at least for a certain number of turns whose protruding portions are electrically interconnected by means of a short-circuit means; whereby self inductance of said filter is reduced.

2. A single-winding capacitive filter having first and second opposite ends and comprising first and second wound discontinuous metal layers separated by a dielectric and forming a plurality of capacitors, some of which having at least a common wound layer and non-common wound layers, the non-common wound layers of said plurality of capacitors each comprise respective portions of said second metal layer and have respective terminals protruding axially from said first end of said filter, wherein at least some portions of said first metal layer protrude from said second opposite end of said filter at least for a certain number of turns whose protruding portions are electrically interconnected by means of a short-circuit means; whereby self inductance of said filter is reduced.

* * * * *